United States Patent [19]
Yoneda

[11] Patent Number: 5,292,401
[45] Date of Patent: Mar. 8, 1994

[54] METHOD OF FORMING A FINE PATTERN

[75] Inventor: Masahiro Yoneda, Itami, Japan

[73] Assignee: Mitsubishi Denki Kabushiki Kaisha, Tokyo, Japan

[21] Appl. No.: 44,009

[22] Filed: Apr. 8, 1993

Related U.S. Application Data

[60] Division of Ser. No. 865,648, Apr. 10, 1992, Pat. No. 5,228,940, which is a continuation of Ser. No. 644,574, Jan. 23, 1991.

[30] Foreign Application Priority Data

Oct. 3, 1990 [JP] Japan ................... 2-263872

[51] Int. Cl.$^5$ .......................... H01L 21/00
[52] U.S. Cl. .................... 156/643; 156/345; 118/728; 118/723 E; 204/192.13; 204/192.32; 204/298.15
[58] Field of Search ........... 156/643, 345; 118/723, 118/728, 729; 204/192.13, 192.32, 298.15

[56] References Cited

U.S. PATENT DOCUMENTS

| | | | |
|---|---|---|---|
| 4,351,805 | 9/1982 | Reisman et al. | 422/202 |
| 4,563,240 | 1/1986 | Shibata et al. | 156/643 |

FOREIGN PATENT DOCUMENTS

| | | |
|---|---|---|
| 0132538 | 2/1985 | European Pat. Off. |
| 3914065 | 10/1990 | Fed. Rep. of Germany |
| 3935189 | 5/1991 | Fed. Rep. of Germany |
| 4-128780 | 3/1992 | Fed. Rep. of Germany |
| 4128779 | 3/1992 | Fed. Rep. of Germany |
| 58-17018 | 2/1983 | Japan |
| 59-94422 | 5/1984 | Japan |
| 60-62460 | 4/1985 | Japan |
| 60-195938 | 10/1985 | Japan |
| 61-87884 | 5/1986 | Japan |
| 61-227169 | 10/1986 | Japan |
| 65-57214 | 3/1987 | Japan |
| 63-219137 | 9/1988 | Japan |
| 1-107539 | 4/1989 | Japan |
| 1-279783 | 11/1989 | Japan |
| 2-229442 | 9/1990 | Japan |

OTHER PUBLICATIONS

Yoneda et al, "Anisotropic Etching of Poly-Si By RIE", Dry Process Symposium, 1981, pp. 47-53.

Primary Examiner—Brian E. Hearn
Assistant Examiner—George Goudreau
Attorney, Agent, or Firm—Leydig, Voit & Mayer

[57] ABSTRACT

A fine pattern forming apparatus includes a stage and an opposed electrode at least one of which is made of a magnetic material. A magnetic field is applied to this stage or opposed electrode to provide a predetermined gap between the stage and the opposed electrode for a fine pattern formation. In consequence, optimum etching conditions (including etching uniformity, etch rate and etching direction) can be assured without generating dust. As a result, damage caused by the plasma can be reduced, and the etch rate can be increased.

9 Claims, 3 Drawing Sheets

METHOD OF FORMING A FINE PATTERN

This application is a division of application Ser. No. 07/865,648, filed Apr. 10, 1992, now U.S. Pat. No. 5,228,940 which is a continuation of application Ser. No. 07/644,574, filed Jan. 23, 1991.

BACKGROUND OF THE INVENTION

1. Field of the Invention

The present invention relates to a fine pattern forming apparatus for forming a fine pattern on a substrate or in a thin film formed on the substrate, and a method of forming the fine pattern.

2. Description of the Related Art

FIG. 1 is a schematic cross-sectional view of a conventional fine pattern forming apparatus, e.g., a plasma etching apparatus. In this apparatus, a semiconductor substrate 2, in which a fine pattern is to be formed, is disposed within a vacuum chamber 1. The semiconductor substrate 2 may be one which has on its surface a polycrystal-line silicon thin film and on the polycrystalline silicon thin film a photoresist pattern serving as a mask which resists etching. In the vacuum chamber 1, the semiconductor substrate 2 is placed on a stage 4 which also serves as an electrode connected to a high-frequency power source 3 for supplying high-frequency power. An opposed electrode 6 with gas nozzles 5 provided therein to uniformly supply an etching gas which is a reactive gas, e.g., chlorine gas, toward the semiconductor substrate 2 is disposed in opposed relation to the semiconductor substrate 2. The vacuum chamber 1 is provided with an evacuation port 7 through which the vacuum chamber 1 is evacuated as well as a reactive gas supply port (not shown) through which the etching gas is supplied into the vacuum chamber 1. An opposed electrode 6 moving means 8 made of, for example, a screw is provided on the portion of the vacuum chamber 1 on which the opposed electrode 6 is mounted so as to provide a predetermined gap between the opposed electrode 6 and the stage 4.

The thus-arranged conventional fine pattern forming apparatus will be operated in the manner described below. First, an etching gas is introduced into the interior of the vacuum chamber 1 from the reactive gas supply port (not shown) through the gas nozzles 5 while the vacuum chamber 1 is evacuated from the evacuation port 7 by an evacuation means (not shown). Next, a high-frequency voltage is applied between the stage 4 and the opposed electrode 6 by the high-frequency power source 3 to generate a glow discharge, by means of which the etching gas introduced into the vacuum chamber 1 is activated and a plasma A is generated, thereby producing active neutral molecules, neutral atoms and ions. Etching of the semiconductor substrate 2 progresses due to the presence of these molecules, atoms and ions, and a fine pattern is thus formed.

The above conventional fine pattern forming techniques has the following drawbacks.

(1) Uniformity of the etch rate

In the conventional techniques, since the gap between the electrodes is fixed or changed mechanically, it is difficult to provide an optimum electrode gap which greatly affects uniformity of the etching. Furthermore, since spatial distribution of the activated halogen gas or ions occurs, when a fine pattern is to be formed on a sample having a large diameter, a non-uniform distribution of the etch rate across the diameter occurs. A reduction in the etch rate requires a large etching chamber.

(2) In the conventional techniques, since the stage 4 can be moved only mechanically, generation of dust caused by the movement cannot be eliminated. In consequence the performance of the apparatus is reduced, and the interior of the chamber 1 must be cleaned frequently. In particular, by-products of the etching gas, which may would be the cause of generation of dust by themselves, adhere to the moving means 8 for the opposed electrode 6 and peel off from the moving means 8 when the semiconductor substrate 2 is placed on or removed from the stage 4, generating dust.

SUMMARY OF THE INVENTION

Accordingly, an object of the present invention is to provide a fine pattern forming apparatus which eliminates dust generation and in which the electrode gap can be changed without contact to ensure excellent fine pattern forming characteristics in the fine pattern formation conducted on various materials by various fine pattern forming methods.

In order to achieve the above object, according to one aspect of the present invention there is provided a fine pattern forming apparatus which comprises: a vacuum chamber; reactive gas supplying means for supplying a reactive gas into the vacuum chamber; a stage disposed within the vacuum chamber for supporting a sample thereon and serving as an electrode, at least part of the stage being made of a magnetic material; an opposed electrode provided in opposed relation to the stage on which the sample is placed; magnetic field generating means for levitating the stage magnetically to provide a predetermined gap between the stage and the opposed electrode; and evacuation means for evacuating the interior of the vacuum chamber.

According to another aspect of the present invention, there is provided a fine pattern forming apparatus which comprises: a vacuum chamber; a reactive gas supplying means for supplying a reactive gas into the vacuum chamber; a stage disposed within the vacuum chamber, the stage for supporting a sample and serving as an electrode; an opposed electrode provided in opposed relation to the stage, at least part of the opposed electrode being made for generating a magnetic material; a magnetic field generating means for generating a magnetic field for levitations the opposed electrode magnetically provide a predetermined gap between the stage and the opposed electrode; and evacuation means for evacuating the interior of the vacuum chamber.

According to still another aspect of the present invention, there is provided a fine pattern forming method which comprises the steps of: placing a sample on which a fine pattern is to be formed on a stage in a vacuum chamber; evacuating the interior of the vacuum chamber to achieve a predetermined degree of vacuum; supplying a reactive gas into the vacuum chamber; applying a magnetic field to levitate one of the stage and an opposed electrode magnetically relation to the stage by a magnetic field generating means to make the stage or the opposed electrode magnetically and thereby maintain a predetermined gap between the stage and the opposed electrode; and generating a plasma of the reactive gas within the vacuum chamber by the stage and the opposed electrode and thereby forming a fine pattern in the sample.

DESCRIPTION OF THE PREFERRED EMBODIMENTS

Figure 1:
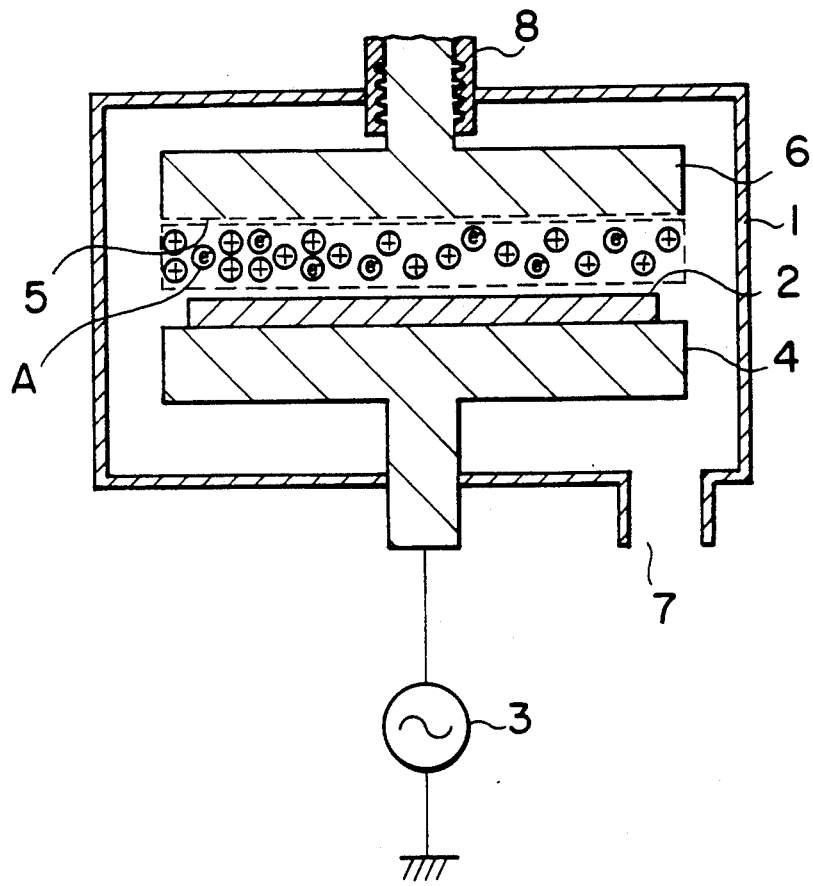
FIG. 1 is a schematic cross-sectional view of a conventional plasma etching apparatus.
Figure 2:
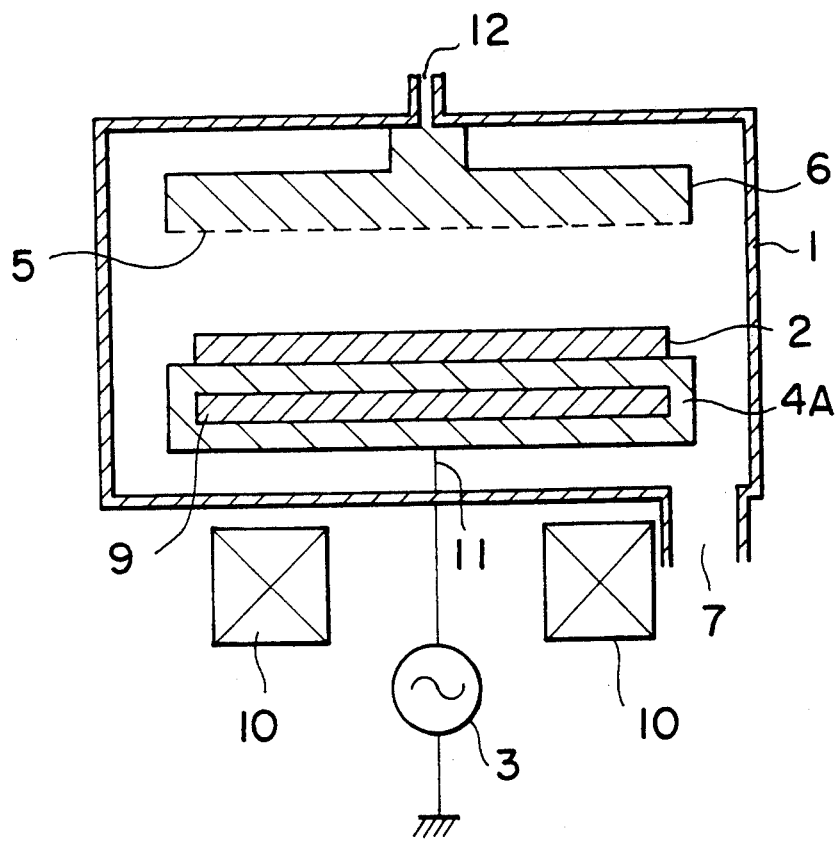
FIG. 2 is a schematic cross-sectional view of a first embodiment of the plasma etching apparatus according to the present invention.

FIG. 2 is a schematic view of a first embodiment of a fine pattern forming apparatus, e.g., a plasma etching apparatus according to the present invention. In FIG. 2, reference numerals 1 to 3, 5 and 7 respectively denote parts which are the same as those of the conventional fine pattern forming apparatus shown in FIG. 1. In the plasma etching apparatus shown in FIG. 2, a magnetic body 9 is embedded in a stage 4A on which the semiconductor substate 2 is placed. The stage 4A also serves as an electrode. An external magnetic field coil 10 which is a magnetic field generating means is disposed outside of the vacuum chamber 1 to levitate the stage 4A magnetically due to the magnetic field generated by the external magnetic field coil 10. The stage 4A is connected to the high-frequency power source 3 via a flexible electric wire 11 or the like.

In the fine pattern forming method which employs the above-described fine pattern forming apparatus, first, the semiconductor substrate 2 is placed on the electrode 4. Next, an etching gas which is a reactive gas is introduced into the vacuum chamber 1 from a reactive gas supply port 12 through the gas nozzles 5 while the vacuum chamber 1 is evacuated from the evacuation port 7. A high-frequency voltage is then applied between the stage 4A and the electrode 6 by the high-frequency power source 3 so as to generate a glow discharge. In consequence, the etching gas introduced into the vacuum chamber 1 is activated and a plasma is thereby generated, generating active neutral molecules, neutral atoms and ions. Etching of the semiconductor substrate 2 progresses due to the presence of these molecules, atoms and ions, and a fine pattern is thus formed.

At that time, a magnetic field is generated by the external magnetic field coil 10 so as to provide a predetermined gap between the opposed electrode 6 and the stage 4A on which the semiconductor substrate 2 is placed due to the repelling force of the magnetic field. When an optimum electrode gap is maintained, the etching characteristics can be improved. Furthermore, the magnitude of the electric field in ion sheaths formed around the electrodes is reduced by the action of the magnetic field generated by the magnetic body 9 buried in the stage 4A, and the colliding energy of the ions can thus be reduced, thereby reducing damage to the substrate processed by the plasma during the process. Furthermore, the density of the ions in the plasma increases due to the magnetic field, thereby increasing the etch rate.

Figure 3:
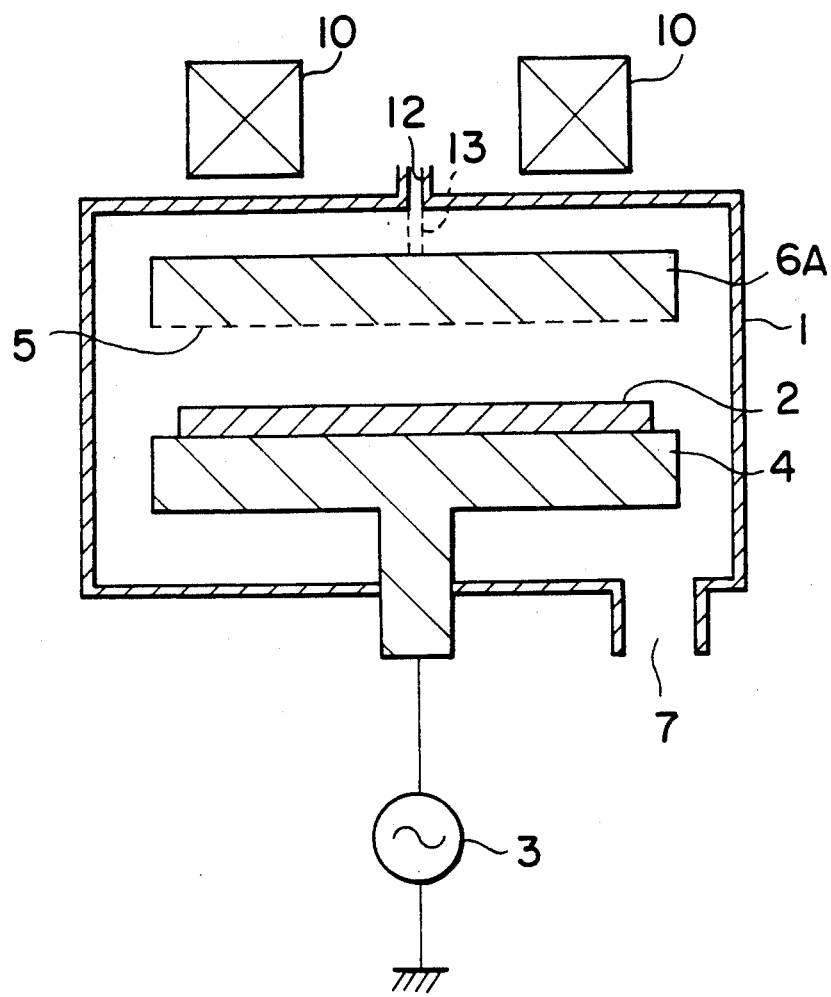
FIG. 3 is a schematic cross-sectional view of another embodiment of the plasma etching apparatus according to the present invention.

In the above-described embodiment, the stage 4A is made to magnetically float. However, as shown in FIG. 3, whereas the stage 4 is fixed, an opposed electrode 6A may be made of, for example, a ferromagnetic material so that it can be made to magnetically float in order to provide an optimum electrode gap. In that case, the reactive gas supply port 12 and the opposed electrode 6A are connected to each other by a flexible pipe 13 or the like.

The above-described embodiment employs as the fine pattern forming method the plasma etching process. However, the present invention is also applicable to the reactive ion etching process, the magnetic field supported reactive ion etching process, the electron cyclotron plasma etching process, the neutral beam etching process, the light excited etching process, the light supported etching process or the physical ion etching process.

The semiconductor substrate 2 with a polycrystalline silicon thin film formed thereon is used as a film on which a fine pattern is to be formed. However, a silicon oxide film, a silicon nitride film or a silicon oxynitride film may also be used. A single crystal silicon film may also be used.

Furthermore, the film in which a fine pattern is formed may be made of tungsten, tantalum, molybdenum, zirconium, titanium, hafnium, chromium, platinum, iron, zinc, tin, a silicide of any of these substances, a nitride of any of these substances or a carbide of any of these substances; aluminum, copper, gold, silver or an alloy which is mainly composed of any of these metals; or an organic polymer such as a novolak resin or polyimide.

Furthermore, the film in which a fine pattern is formed may be a ferroelectric material such as PZT, (lead, zinc, tin), a superconductor including an oxide superconductor or a ferromagnetic material.

The above embodiment employs as a sample, i.e. a substance, to be processed, the thin film formed on the semiconductor substrate 2 in the semiconductor integrated circuit manufacturing process. However, the present invention is also applicable to a substrate of a magnetic tape or of a magnetic disk employed in magnetic storage apparatus which is subjected to a storage device forming process, a substrate for an optical disk or the like employed in optical storage apparatus which is subjected to a storage device forming process, a metal shaped substance, a thin film formed on the surface of the metal shaped substance, a machine component such as a screw or a machining tool.

As will be understood from the foregoing description, in the fine pattern forming apparatus and method according to the present invention, since the stage on which the sample is placed or the opposed electrode is made to magnetically levitate and is thereby moved without contact to adjust the electrode gap, optimum etching conditions (including etching uniformity, etch rate and etching direction) can be assured without generating dust. In consequence, damage caused by the plasma can be reduced, and the etch rate can be increased. These enable excellent fine pattern formation.

What is claimed is:

1. A fine pattern forming method comprising the steps of:
    placing a sample on which a fine pattern is to be formed on a stage in a vacuum chamber;
    evacuating the interior of said vacuum chamber to achieve a predetermined degree of vacuum;
    supplying a reactive gas into said vacuum chamber;
    applying a magnetic field to levitate one of said stage and an opposed electrode located in said vacuum chamber to maintain a predetermined gap between said stage and said opposed electrode; and
    generating a plasma of said reactive gas within said vacuum chamber by said stage and said opposed electrode, thereby forming a fine pattern in said sample.

2. A fine pattern forming method according to claim 1 wherein said fine pattern forming method is a plasma etching method.

3. A fine pattern forming method according to claim 1 wherein said fine pattern forming method is a reactive ion etching method.

4. A fine pattern forming method according to claim 1 wherein said fine pattern forming method is a magnetic field supported reactive ion etching method.

5. A fine pattern forming method according to claim 1 wherein said fine pattern forming method is a electron cyclotron plasma etching method.

6. A fine pattern forming method according to claim 1 wherein said fine pattern forming method is a neutral beam etching method.

7. A fine pattern forming method according to claim 1 wherein said fine pattern forming method is a light excited etching method.

8. A fine pattern forming method according to claim 1, wherein said fine pattern forming method is a light supported etching method.

9. A fine pattern forming method according to claim 1 wherein said fine pattern forming method is a sputter etching method.

* * * * *